(12) United States Patent
Adir et al.

(10) Patent No.: US 7,673,261 B2
(45) Date of Patent: Mar. 2, 2010

(54) SYSTEMATIC COMPLIANCE CHECKING OF A PROCESS

(75) Inventors: Alion Adir, Kiryat Tivon (IL); Sigal Asaf, Zichron Yaakov (IL); Laurent Fournier, Givat Ela (IL); Itai Jaeger, Lavon (IL); Ofer Peled, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 443 days.

(21) Appl. No.: 11/672,050

(22) Filed: Feb. 7, 2007

(65) Prior Publication Data

US 2008/0189094 A1 Aug. 7, 2008

(51) Int. Cl.
*G06F 17/50* (2006.01)
(52) U.S. Cl. .............................................. 716/4; 716/5
(58) Field of Classification Search .................. 716/1–5
See application file for complete search history.

(56) References Cited

U.S. PATENT DOCUMENTS

| 5,394,347 | A | 2/1995 | Kita et al. | |
| 6,038,378 | A | 3/2000 | Kita et al. | |
| 2005/0278702 | A1* | 12/2005 | Koyfman et al. | 716/4 |

FOREIGN PATENT DOCUMENTS

WO WO2004/107087 12/2004

OTHER PUBLICATIONS

Y. Lichtenstein et al., *Model-Based Test Generation for Process Design Verification*, Sixth Innovative Applications of Artificial Intelligence Conference, Aug. 1994, pp. 83-94.
A. Chandra, et al., *AVPGEN—A Generator for Architecture Verification Test Cases*, IEEE Trans. Very Large Scale Integration (VLSI) Syst. 3, No. 2, pp. 188-200 (Jun. 1995).
R. Emek, et al., *X-Gen, a random test-case generator for systems and SoCs*, Seventh IEEE International High-Level Design Validation and Test Workshop (HLDVT 2002).
Pari Salas, Percy Antonio et al. *Automatic Test Case Generation for OCL: a Mutation Approach*, , United Nations University International Institute for Software Technology UNU-IIST and UNU-IIST Reports, Report No. 321, May 2005.
Suet Chun Lee; Offutt, J., Generating test cases for XML-based Web component interactions using mutation analysis, 2001 IEEE.

* cited by examiner

*Primary Examiner*—Paul Dinh

(57) ABSTRACT

Methods and systems are presented for generation of a test suite in order to validate compliance of a process with its process specification. The methodology involves a formal description of the process using a flowchart, refinement of the flowchart to include misinterpretations of the process specification, defining compliance coverage models over the flowchart, and automatically generating test case scenarios that cover the models. Internal and external types of misinterpretation are distinguished. A compliance test suite is automatically generated and observations made of the details of the traversal through the flow chart when the tests are executed.

17 Claims, 4 Drawing Sheets

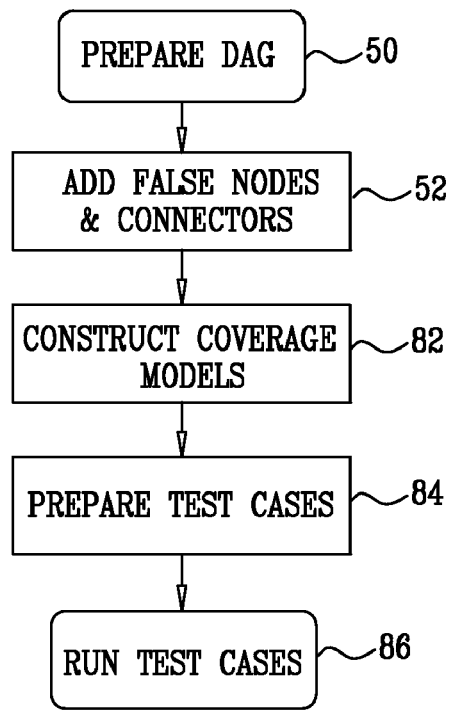
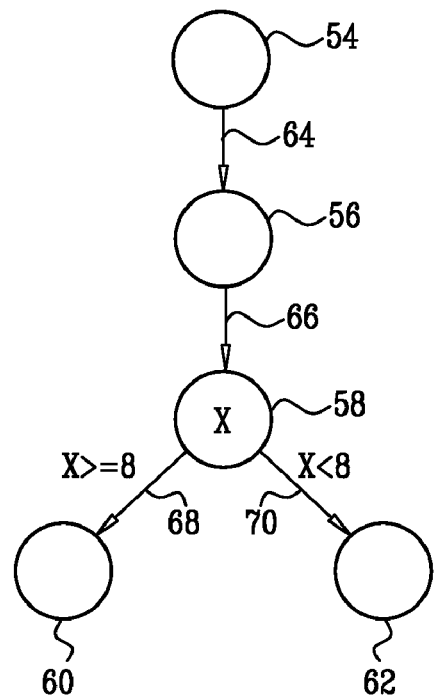
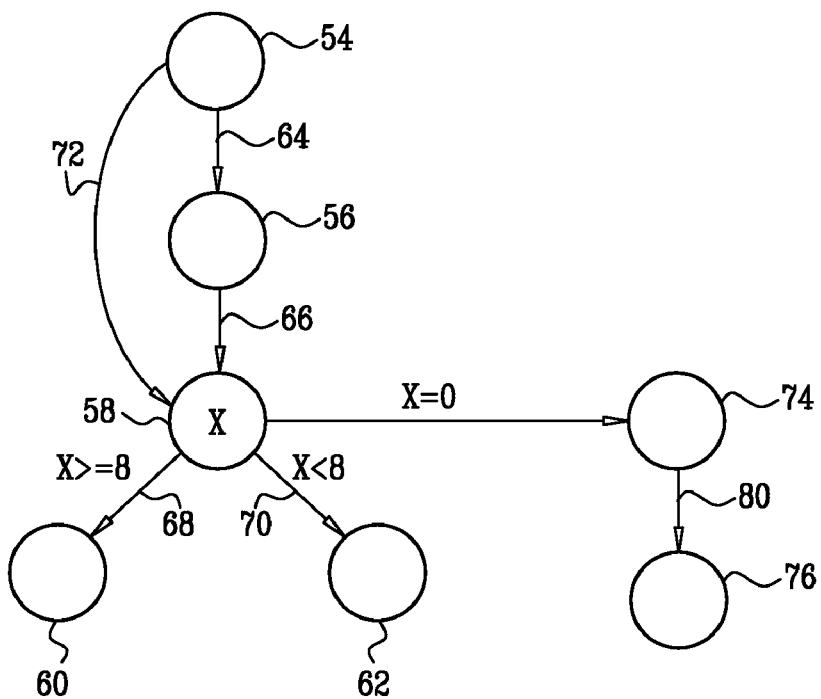

SYSTEMATIC COMPLIANCE CHECKING OF A PROCESS

BACKGROUND OF THE INVENTION

1. Field of the Invention

This invention relates generally to design and process verification. More particularly, this invention relates to evaluation of a process or a design for compliance with its specification.

2. Description of the Related Art

TABLE 1

| Acronyms and Abbreviations | |
|---|---|
| CSP | Constraint Satisfaction Problem |
| DAG | Directed Acyclic Graph |
| ISA | Instruction Set Architecture |

Important aspects of designing a system that operates according to process sequences include the ability to test the design thoroughly, in order to assure that the design complies with desired architectural, performance and design specifications.

Test program generators are basically sophisticated software engines, which are used to create numerous test cases to be executed by the design-under-test. By appropriate configuration, it is possible for test generation to be focused on very specific ranges of conditions, or broadened to cover a wide range of logic. Today, large numbers of test cases can be created automatically in the time that a single test case could be written manually, as was done prior to the advent of test case generators.

An example of a conventional test program generator is the IBM tool, Genesys, which is disclosed in the document *Model-Based Test Generation for Process Design Verification*, Y. Lichtenstein et al., Sixth Innovative Applications of Artificial Intelligence Conference, August 1994, pp. 83-94. An updated version, of Genesys, known as Genesys-Pro, is a generic random test generator, targeted at the architectural level and applicable to any architecture.

Another conventional test program generator, AVPGEN, is disclosed in the document *AVPGEN—A Generator for Architecture Verification Test Cases*, A. Chandra, et al., IEEE Trans. Very Large Scale Integration (VLSI) Syst. 3, No. 2, pp. 188-200 (June 1995).

X-Gen, a model-based test-case generator, is described in the document *X-Gen, a random test-case generator for systems and SoCs*, R. Emek, et al., Seventh IEEE International High-Level Design Validation and Test Workshop (HLDVT 2002). This test generator is specialized for use with multi-processor systems and systems on a chip (SoCs). X-Gen provides a framework and a set of building blocks for system-level test-case generation. Test program generation using X-Gen typically involves the resolution of constraints to make the tests legal and interesting for verification.

Varied strategies have been devised to influence or control the operation of test generators in order to achieve test coverage within a reasonable time and expenditure of resources. One of these strategies is the use of labeled transition systems to model the behavior of processes. For example, the patent document WO 2004/107087 proposes providing the specification of an application in the form of flow graphs. A computer system examines or traverses the flow graphs to generate various test paths. A user may then specify different input value combinations associated with each test path to generate a corresponding number of test cases, and thereby test the application exhaustively.

In another approach to test generation, the document *Automatic Test Case Generation for OCL: a Mutation Approach*, Pari Salis, Percy Antonio et al., United Nations University International Institute for Software Technology UNU-IIST and UNU-IIST Reports, Report No. 321, May 2005, proposes mutation of a specification, in order to model errors that can happen during the development process, followed by generation of test cases that cover the introduced errors. In this system, a language known as Object Constraint Language is used to express formal constraints in the context of a model.

SUMMARY OF THE INVENTION

An embodiment of the invention provides a method for validating compliance of an implementation of a process with a specification of the process. The method is carried out by modeling the process as a directed acyclic graph in which nodes represent stages of the process, and edges represent transitions between the stages, defining a coverage model for the graph that includes correct traversal paths and erroneous traversal paths therein, defining a set of test cases for the implementation according to the coverage model, executing the implementation using the set of test cases, observing that one of the erroneous traversal paths was followed in the execution, and then concluding that the implementation includes a misinterpretation of the specification.

In one aspect of the method false nodes and false edges that form false traversal paths are introduced into the graph, which represent new transitions between the stages and correspond respectively to external misinterpretations of the specification. The method includes determining than one of the false traversal paths was followed in the execution, and thereafter concluding that the implementation has an external misinterpretation of the specification.

Other embodiments of the invention provide software product and apparatus for carrying out the method.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein:

FIG. 3 is a flow chart of a method for systematic compliance checking of a process implementation in accordance with a disclosed embodiment of the invention;

FIG. 4 is a directed acyclic graph representing an exemplary process in accordance with a disclosed embodiment of the invention;

FIG. 5 is a refined version of the directed acyclic graph shown in FIG. 4 in accordance with a disclosed embodiment of the invention;

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems.

System Overview.

Aspects of the invention involve the generation of a test suite in order to validate compliance of a process with its process specification. The methodology involves a formal description of the process using a flowchart, refinement of the flowchart to include misinterpretations of the process specification, defining compliance coverage models over the flowchart, and automatically generating test case scenarios that cover the models. Different classes of misinterpretation, described in further detail below, are distinguished. A compliance test suite is generated and observations made of the details of the traversal through the flow chart when the tests are executed. If incorrect or inappropriate paths through the flowchart are followed during the test case executions, it may be concluded that the process implementation contains misinterpretations of the process specification and is noncompliant.

Figure 1:
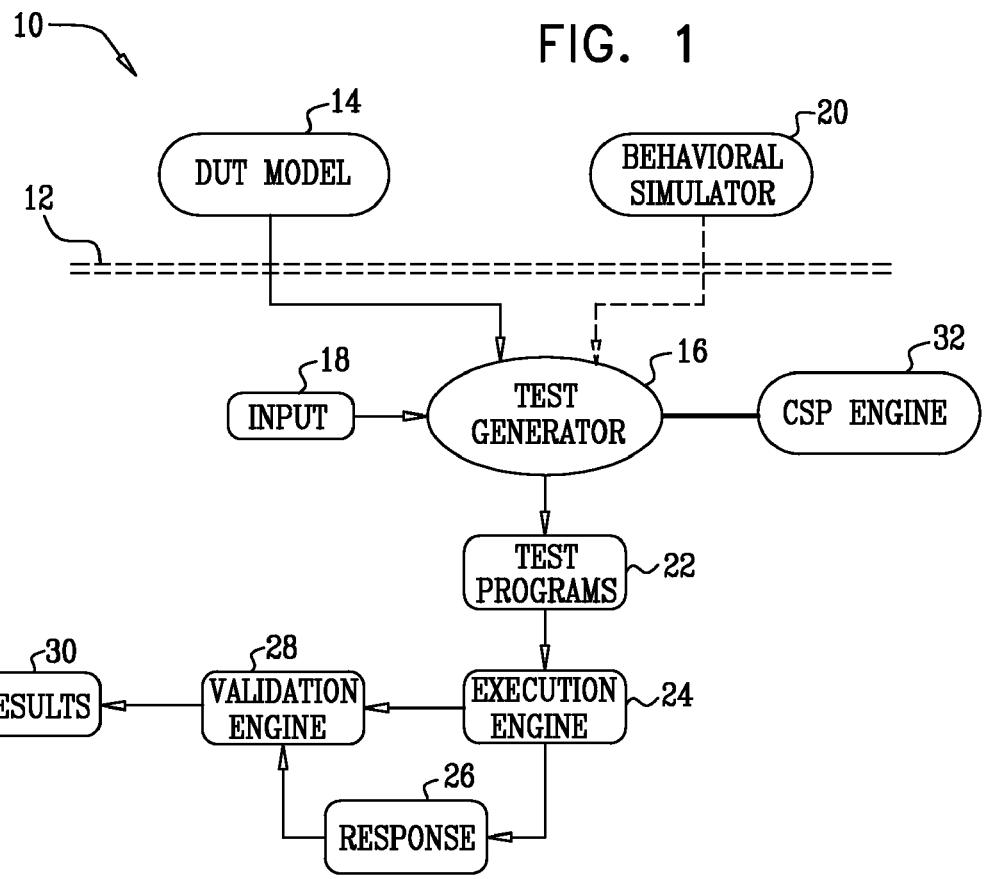
FIG. 1 is a block diagram of a system that is operable in accordance with a disclosed embodiment of the invention.

Turning now to the drawings, reference is made to FIG. 1, which is a block diagram of a system 10 that is operable in accordance with a disclosed embodiment of the invention. The teachings of the present invention are not restricted to systems that are configured like the system 10, but are applicable to many testing systems that have different architectures than the system 10. Typically, a process or design-under-test is verified using a suite of test cases that are generated by the system.

The system 10 typically comprises a general purpose or embedded computer processor, which is programmed with suitable software for carrying out the functions described hereinbelow. Thus, although the system 10 is shown in FIG. 1 as comprising a number of separate functional blocks, these blocks are not necessarily separate physical entities, but rather represent different computing tasks or data objects stored in a memory that is accessible to the processor. These tasks may be carried out in software running on a single processor, or on multiple processors. The software may be provided to the processor or processors in electronic form, for example, over a network, or it may be furnished on tangible media, such as CD-ROM or nonvolatile memory. Alternatively or additionally, the system 10 may comprise a digital signal processor or hard-wired logic.

In any case, the system 10 can be used for verifying a process or design-under-test generally, or a software or hardware implementation. The system 10 has several basic interacting components. Those components that are located above a broken line 12 are dependent on the specification of the design-under-test, while those located below the line 12 are independent of the specification.

The system 10 enables the creation of tests that have various degrees of randomness. The ability of the system 10 to introduce random unspecified values is desirable, since design flaws in practice are usually unpredictable.

A model 14 holds a formal description or specification of the process or design-under-test. This specification may be stored in a database, which may also incorporate testing knowledge of the system design, and may include testing constraints and coverage criteria. The term "coverage" concerns checking and showing that testing has been thorough. A coverage metric is any metric of completeness with respect to a test selection criterion for the design-under-test.

A generic test program generator engine 16 has a user input 18, which influences the algorithms used to generate test cases.

An optional behavioral simulator 20 can be used to predict the results of instruction execution in accordance with the specification of the process or design-under-test. It is possible to employ the techniques of the invention in systems that do not employ a behavioral simulator.

Test programs 22 are executed by an execution engine 24 on an implementation of the process or design-under-test. The execution engine 24 can be a simulator of the process or design-under-test, or the implementation itself. The process or design-under-test includes a process specification, which can be the behavior of instructions from a processor instruction set architecture (ISA), or address translation description in a processor architecture. The techniques disclosed herein are applicable to many other processes employed in far-flung areas of design, e.g., transportation loading control, manufacturing processes, and chemical processes. The process or design-under-test could be an aspect of a complex software implemented system, for example middleware, or a hardware simulator. Indeed, it may be a simulator.

Execution of the test programs 22 stimulates the design-under-test, and produces a response 26. The response 26 is typically submitted to an evaluation process, represented in FIG. 1 as a compliance validation engine 28. Unlike conventional validation engines, which look at test outcomes and compare them with expected results, the validation engine 28 is additionally adapted to evaluate the flow of the process, for example particular steps taken as a result of the stimulation, and the order of the steps, corresponding to a flow chart of the process, described in further detail hereinbelow. The flow is observed in the response 26, and reported as compliance validation results 30.

In some embodiments, at least a portion of the test programs 22 that are produced by the test program generator engine 16 are solutions of constraint satisfaction problems (CSP's), which are formulated and solved using a CSP engine 32. In general, constraint solution in test generation involves identifying conditions on outputs or intermediate values that are important to test and then solving for input values that lead to these conditions. Many known CSP engines can be used as the CSP engine 32.

Compliance Checking vs. Validation.

In one aspect of the invention, a process is specified for a design-under-test. Evaluation of the implementation that executes or performs the process is facilitated by representing the process as a flow chart in the form of a directed acyclic graph (DAG), in which each node represents some step to be completed and directed edges extending between the nodes correspond to transitions between steps. The leaves of the directed acyclic graph typically represent outcomes of the process. An outwardly directed edge extends from a first node toward a second node generally toward a leaf.

An aspect of the invention is concerned with compliance checking, which is equivalent to determining whether the realization of the process in the design-under-test complies with the specification of the process. Compliance checking as used herein is differentiated from verification or validation of a design-under-test. Verification and validation refer to the entire process of uncovering flaws, with the ultimate goal of making the subject under test as bug-free as possible. The scope of compliance validation is limited to ensuring that the subject under test, whether a design or process, has been correctly interpreted in its implementation. Compliance validation does not concern itself with implementation details. The development of a design can be viewed conceptually as comprising three stages:

(1) development of a standard or specification;
(2) activities leading to the design of an embodiment of the standard or specification; and
(3) implementation of the design.

Noncompliance with the standard typically creeps into this scheme between stages (1) and (2), although it also can occur between stages (2) and (3).

In general, an implementation is not compliant with its specification, if for some inputs, the result calculated by the implementation differs from those defined by the specification. However, in some cases an implementation is not compliant with the specification even when the calculated results do agree with those defined by the specification. This can be appreciated from consideration of an exemplary directed acyclic graph.

Figure 2:
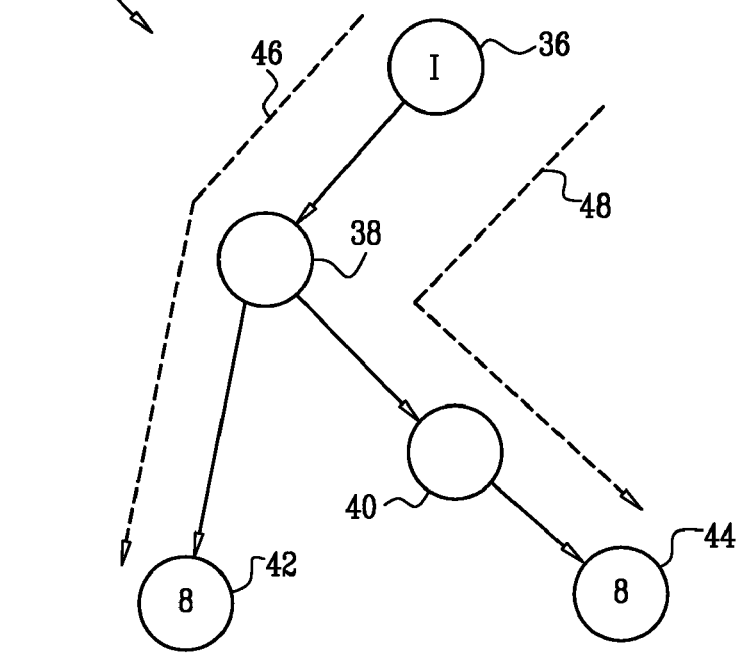
FIG. 2 is a fragment of a directed acyclic graph that describes a process in accordance with a disclosed embodiment of the invention.

Reference is now made to FIG. 2, which is a fragment of a directed acyclic graph 34 that describes a process in accordance with a disclosed embodiment of the invention. The input to the process, I, is shown in a root 36. The directed acyclic graph 34 has intermediate nodes 38, 40 and leaves 42, 44, which can be reached from the root 36 by a first path 46 (root 36→node 38→leaf 42) and by a second path 48 (root 36→node 38→node 40→leaf 44), in which the paths 46, 48 are shown as broken lines. Assume that the process specification dictates that the implementation would follow the path 46.

The outcomes of the process, shown in the leaves 42, 44 are both the value 8. A conventional functional validation technique, in which a test case had the input I, would not reveal any flaws in this process. Indeed, the process does run correctly with the input tested, yet it may not comply with its specification. The conventional functional validation technique does not inform whether, under the given conditions, the correct path 46 or the incorrect path 48 was followed in order to achieve the value 8.

According to an aspect of the invention, compliance checking involves observation of the paths taken by the process through a directed acyclic graph that represents the process.

Several classes of false implementations of the process are automatically recognized:

1. The implementation may ignore parts of the specification.
2. The implementor may have misinterpreted the specification, causing a wrong decision to be taken, e.g., at the node 38 (FIG. 2).
3. There may be misinterpretations of an architecture or other design aspects, which are observed when the specification unites the behavior of several similar components, e.g., the description of a group of instructions in an instruction set architecture.

While aspects of the invention detect all of the above classes, it is also helpful to distinguish two broad types of misinterpretations:

Internal (explicit) misinterpretations are intrinsic to the specification. For example, a specification may require that a transition A→B be performed in all cases except a special case Y. An implementer may fail to provide for the special case Y.

External (implicit) misinterpretation stems from external domain knowledge. Thus, a specification may define some term X as having a meaning that differs from the meaning of a similar term in other specifications. The implementer may fail to appreciate the difference and implement the term X as it would be implemented in the other specifications. For example, the computer instructions ADD and SUB, representing addition and subtraction, respectively, are often implemented similarly in different instruction sets. A difference specifying these instructions in a current specification may easily be missed by the implementer if the difference is uncommon in the art.

Finally, an implementer may have understood the specification perfectly, but implemented it defectively. This condition may also be detected by embodiments of the invention. However, this is a design error within the domain of conventional functional validation.

Operation.

Reference is now made to FIG. 3, which is a flow chart of a method for systematic compliance checking of a process implementation in accordance with a disclosed embodiment of the invention. At initial step 50, the process is represented as a directed acyclic graph. Generally, for a given input some paths through this graph are correct and some are incorrect, i.e., if the process follows an incorrect path, it is not compliant with its specification. The directed acyclic graph is used to represent the possible misinterpretations related to process.

Next, at step 52, a set of false-implementations is defined, in which each member of the set includes only one mistaken interpretation. The directed acyclic graph prepared in initial step 50 is modified by the additions of new edges and new nodes that represent members of the set of misinterpretations. These are known as "false edges" and "false nodes", respectively. A false edge includes a transition condition, which does not exist in the original specification. A false edge emulates the behavior of a false implementation. An implementation that follows such a false edge would generate an incorrect result for some inputs. The original edges and nodes of the directed acyclic graph are referred to as true edges and true nodes.

Step 52 is typically performed automatically in part and in part by human experts, who anticipate errors of implementation that could be made, e.g., the choice of an incorrect path at a node, or failure to recognize the significance of a fork in a path resulting in treatment of both options identically. The latter error is often reflected in incorrect handling of boundary conditions.

Reference is now made to FIG. 4, which is a directed acyclic graph representing an exemplary process following performance of initial step 50 (FIG. 3), in accordance with a disclosed embodiment of the invention. The process has a root 54, intermediate nodes 56, 58, leaves 60, 62, and edges 64, 66, 68, 70. A value x is an intermediate value that has been achieved when the process arrives at the node 58. When the value x is equal to or greater than eight, the edge 68 is followed, terminating at the leaf 60. Otherwise, the edge 70 is followed, terminating at the leaf 62.

Reference is now made to FIG. 5, which is a directed acyclic graph representing the specified process shown in FIG. 4 following performance of step 52 (FIG. 3), in accordance with a disclosed embodiment of the invention. At step 52 it was determined that one misinterpretation of the process specification would result in failure to execute operations represented by the node 56. This misinterpretation is represented by a false edge 72, extending from the root 54 to the node 58. Another possible misinterpretation would implement special treatment when x is zero. Such special treatment is not prescribed by the process specification. This misinterpretation is represented by a false node 74, a false leaf 76, and false edges 78, 80 that form a false path beginning at the node 58.

Referring again to FIG. 3, after completion of step 52, a coverage model is constructed at step 82 for the modified directed acyclic graph. Examples of coverage models include:

Wrong edge: the process goes down a wrong true edge instead of the right true edge coming out of the same node (because of a misinterpretation of the conditions of the true edges.

False edge: the process goes down a false edge instead of the appropriate true edge coming out of the same node (because the existence of the false edge was wrongly assumed).

This step is discussed in further detail below in the section entitled Coverage Models.

Next, at step 84, the coverage model is automatically applied to develop test cases for the design-under-test. In some embodiments, each test case is formulated as a constraint satisfaction problem and solved, based on static information, i.e., knowledge of the outcomes of the true and false process steps, by a CSP engine. The intent is to create sets of test cases, each set covering a particular problem or misinterpretation of the process specification, which corresponds to particular paths that are followed when the test case executes. These test cases cover paths that are intrinsic to the process model, but which are incorrect for particular inputs. Such paths correspond to internal misinterpretations of the process specification. The test cases also cover paths through false nodes, which correspond to external misinterpretations of the process specification. The solution of the constraint satisfaction problem involves finding an input that produces distinct outputs according to whether paths representing correct or incorrect interpretations of the specification are followed during execution of the test cases.

In each such set of test cases there may be a variety of inputs to the process. All of them produce an output that derives from a single misinterpretation. In the resulting test suite, there is be at least one test case in each set, that is to say one test case for each possible false implementation. The suite of test cases thus covers the misinterpretations that were represented by the addition of false nodes and false edges in step 52, whether generated automatically or by human operators.

In general the test cases are prepared such that different calculated results correspond to alternate paths through the directed acyclic graph. Thus, by observing the calculated results, it is possible to infer whether a path taken was a true path or a false path, respectively compliant or noncompliant with the process specification.

In this regard, it may be noted that in the case of the directed acyclic graph 34 (FIG. 2), the input I would not constitute a suitable test case, as it produces non-unique results at the leaves 42, 44.

Then, at final step 86, the test cases are run. The results are evaluated by inferring the nodes that were visited and the edges of the directed acyclic graph that were traversed based on the correspondence of the final calculated results with the paths traversed through the directed acyclic graph. If false nodes were visited or false edges traversed, it is concluded that the process is not compliant with its specification.

Example 1

An example of false behavior is taken from the PowerPC™ architecture. The setting of XER[CA] in FX-Add instructions depends on the value of MSR[SF] bit while the setting of XER[CA] in FX-Shift instruction does not depend on the value of MSR[SF]. In a DAG, which describes the setting of XER[CA] in FX-Shift instructions we added features that represent the behavior of a false-implementation that does use the MSR[SF] for setting the XER[CA].

Coverage Models.

All wrong edge and false edge misinterpretations (with observability):

This model covers all cases where some wrong true or false edge was taken instead of the correct true edge. There are $$E_{true(n)} \cdot (E_{true(n)} - 1)/2$$

pairs of true edges and $$E_{true(n)} \cdot E_{false(n)}$$

pairs of true and false edges for every node. Not all these combinations are actually possible and thus the model includes at most $$\sum_n E_{true(n)} \cdot ((E_{true(n)} - 1)/2 + E_{false(n)}).$$

Path Coverage with Observability.

Figure 6:
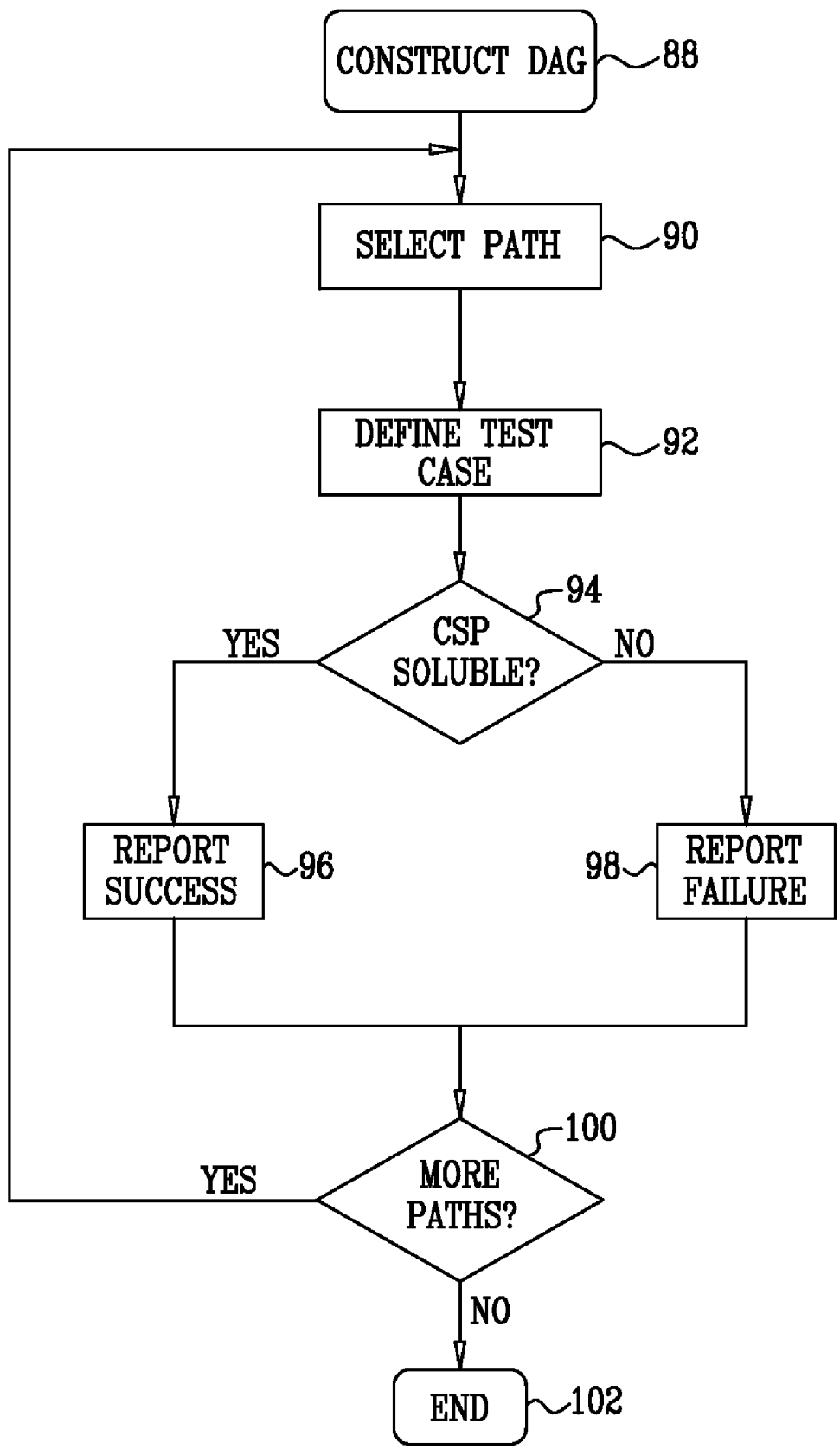
FIG. 6 is a flow chart describing a method of covering a model of a process or design-under-test in accordance with a disclosed embodiment of the invention.

Reference is now made to FIG. 6, which is a flow chart describing a method of covering a model of a process or design-under-test in accordance with a disclosed embodiment of the invention. For every path of true edges from the root to some leaf, a path coverage model contains a single task where the path was not taken because some true edge was missed and a wrong true or false edge taken instead. The number of tasks in this model is the number of paths in the directed acyclic graph. A path coverage model according to an aspect of the invention is termed "path coverage with observability".

At initial step 88 a modified directed acyclic graph is prepared as described above in step 52 (FIG. 3).

Next, at step 90, a path through the DAG is selected.

Next, at step 92 a sequence begins in which a test case is defined in which the process flows through the current path.

Control now proceeds to decision step 94, where it is determined if it is possible to solve a CSP in order to comply with constraints for the current path. In Example 1 above, if the final assignment constraint of the current path were 'XER[OV]=1' then the XER[OV] input value should be different from 1, in order to clearly show that the final value was set during execution and did not simply occur by chance.

If the determination at decision step 94 is affirmative, then control proceeds to step 96. The leaf resource is constrained and successful test definition is recorded.

If the determination at decision step 94 is negative, then it is necessary to disregard the current path. Unsuccessful test definition is reported at step 98.

In either event, proceeds to decision step 100, where it is determined if there are more paths to be processed in the directed acyclic graph. If the determination at decision step 100 is affirmative, then control returns to step 90 for another iteration.

If the determination at decision step 100 is affirmative, then the suite of test cases is complete. Control proceeds to final step 102, and the procedure ends.

Edge Coverage with Observability.

In another aspect of the invention, test cases are to be generated such that there exists a test case for each edge in a modified directed acyclic graph. An edge coverage model contains a single task for every edge, totaling E tasks overall. For every true edge, this model covers a case where some other true edge was taken instead. For every false edge, this model covers a case where the false edge was taken instead of a true edge. Test cases are generated subject to constraints such that a test that follows a correct edge produces a different result from a test that follows a false edge. This is achieved by a process referred to as "edge separation".

Figure 7:
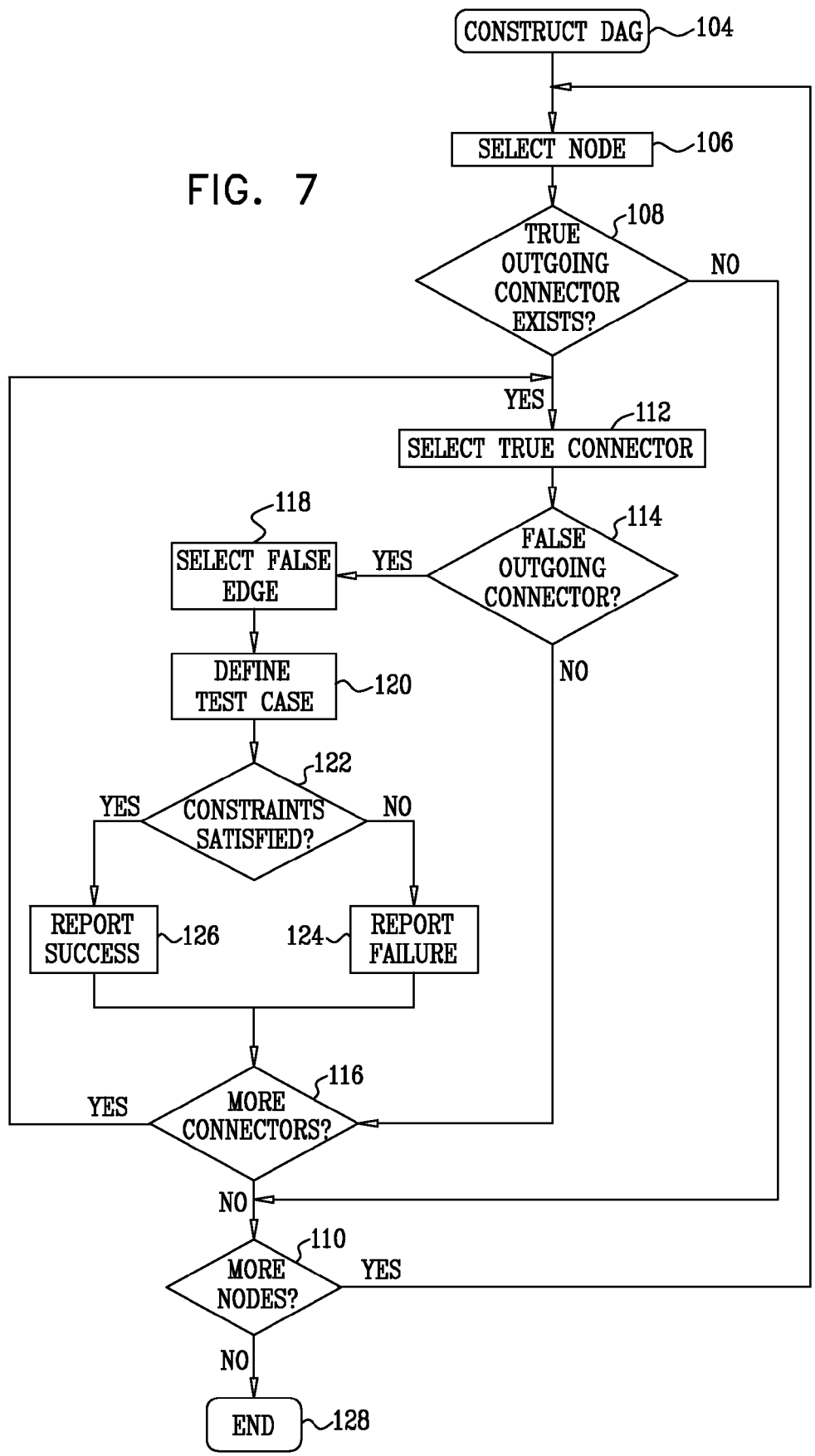
FIG. 7 is a flow chart describing another coverage metric and the construction of suite of test cases for a design-under-test in accordance with a disclosed embodiment of the invention.

Reference is now made to FIG. 7, which is a flow chart describing a coverage metric and the construction of suite of test cases for a design-under-test in accordance with a disclosed embodiment of the invention. The metric is termed "edge coverage with observability".

At initial step 104, a modified directed acyclic graph is prepared as described above in step 52 (FIG. 3).

Next, at step 106 a node of the modified directed acyclic graph is selected.

Control now proceeds to decision step 108, where it is determined if the current node has a correct "true" outgoing edge. The rationale for this step is to select nodes having a correct edge and at least one false edge, and to then define test cases, which allow observation of a path through the false edge, the results of which can be distinguished from a calculated path through the correct edge. If the determination at decision step 108 is negative, then it is concluded that the current node is a false node, lying on a false path. No possibility of distinguishing between true and false outgoing edges exists. Control proceeds directly to decision step 110, which is described below.

If the determination at decision step 108 is affirmative, then control proceeds to step 112. The "true" edge is chosen for use as the current outgoing edge.

Control now proceeds to decision step 114, where it is determined if the current outgoing edge is a false edge. If the determination at decision step 114 is negative, then control proceeds directly to decision step 116, which is described below.

If the determination at decision step 114 is affirmative, then at step 118 the false connector is selected for consideration, and control proceeds to step 120. A test case is defined that follows the current "true" outgoing edge. It will be recalled that a true outgoing edge was determined to exist in decision step 108. It is necessary, however, that constraints be observed such that the calculated result of the current test case differ according to whether the true outgoing edge or the false edge selected in step 118 were followed. Thus, the test case is formulated as a constraint satisfaction problem.

Control now proceeds to decision step 122, where it is determined if it was possible to satisfy the constraints for the current test case, that is, to solve the constraint satisfaction problem. If the determination at decision step 122 is negative, then at step 124 failure is reported. It is concluded that edge separation cannot be achieved between the current false edge and the correct edge of the current node. Otherwise, success is reported at step 126. It is concluded that edge separation can be achieved using the current test case.

In either case, control next proceeds to decision step 116, where it is determined if more edges remain to be evaluated for the current node. It is possible that more than one false interpretation is possible, and multiple test cases may need to be devised to determine, which possible misinterpretation of the process specification was actually implemented. If the determination at decision step 116 is affirmative, then control returns to step 112.

If the determination at decision step 116 is negative, then the current node has been fully evaluated. Control proceeds to decision step 110, where it is determined if more nodes remain to be evaluated in the directed acyclic graph. If the determination at decision step 110 is affirmative, then control returns to step 106 to begin another iteration.

If the determination at decision step 110 is negative, then control proceeds to final step 128. A report may be generated indicating how much of the model was in fact covered by iterations of the foregoing steps.

Automatic Coverage.

Referring again to FIG. 1, it is possible to develop the test cases according and evaluate the two above-described coverage metrics automatically. To do this the CSP representation of a path (path.csp_representation) is employed, which is the intersection of the path's transition constraints. The path is formally is defined using the following algorithm:

```
path.csp_representation <- true;
for each edge (current_c) in the path
    path.csp_representation <-
        path.csp_representation INTERSECT
        (current_c.transition_constraint)
```

Automatic generation of path coverage with observability can be accomplished using the algorithm shown as pseudocode in Listing 1. Automatic generation of edge coverage with observability can be accomplished using the algorithm shown as pseudocode in Listing 2.

Constraint Satisfaction.

Referring again to FIG. 1 and the CSP engine 32, the use of constraint satisfaction problem solution in test generation is described, for example, in commonly-assigned U.S. Patent Application Publication No. 2005/0222827, entitled Accelerated Solution of Constraint Satisfaction Problems by Partitioning of the Variable Space. Constraint satisfaction techniques are further described in the document *Using Constraint Satisfaction Formulations and Solution Techniques for Random Test Program Generation*, E. Bin, R. Emek, G. Shurek, and A. Ziv, IBM Systems Journal, 41(3): 386-402, August 2002, and the document *Algorithms for Constraint-Satisfaction Problems: A Survey*, V. Kumar, A. I. Magazine, 13(1): 32-44, Spring 1992.

Many of the tasks that are addressed by decision-making systems and artificial intelligence can be framed as constraint satisfaction problems (CSP's). In this framework, the task is specified in terms of a set of variables, each of which can assume values in a given domain, and a set of predicates, or constraints, that the variables must simultaneously satisfy. The set of variables and constraints is referred to as a constraint network. Each constraint may be expressed as a relation, defined over some subset of the variables, denoting valid combinations of their values. A solution to the problem (referred to hereinbelow as a "concrete solution") is an assignment of a value to each variable from its domain that satisfies all of the constraints.

For example, Bin et al. describe a constraint satisfaction method for use in automated generation of test programs, in a paper entitled "Using a Constraint Satisfaction Formulation and Solution Techniques for Random Test Program Generation," IBM Systems Journal 41:3 (2002), pages 386-402. The authors show how random test program generation can be modeled as a CSP, and they describe a set of solution techniques that are used in practical test-case generation tools.

A number of constraint satisfaction systems are described in the patent literature. For example, U.S. Pat. No. 5,636,328, describes methods and apparatus for finding values that satisfy a set of constraints, applied particularly to control of a robotic arm. U.S. Pat. No. 5,617,510 describes a method, useful in computer-aided design, of identifying possible solutions to an over-constrained system having a collection of entities and constraints.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

Computer Program Listings

```
                        Listing 1
for each path (current_path) in the graph
  build CSP problem 1 (csp1) as follows:
  // csp1 represents the intersection of
current_path.csp_representation with the negation of the
path's assignment constraint
    csp1 <- current_path.csp_representation INTERSECT
(negation of current_path.leaf_node.assignment_contraint)
    solve csp1
    if a solution was found
      generate the corresponding test case
    else
      build CSP problem 2 (csp2):
        // csp2 is equal to csp1
        but dropping the requirement on the
        assignment_constraint
      csp2 <- path.csp_representation
      solve csp2
      generate the corresponding test case
                        Listing 2
for each node (n) in the graph
  for each outgoing edge (true_c) from node n
    if true_c is a false edge than
      continue
          for each outgoing edge (falsc_c) from node n
            if (true_c == false_c)
              continue
      build csp1 problem as follows:
        // generating the csp problem that represents one of the
          paths from root-node to true_c
      input_paths_csp <- false
      for each path (input_path) from root-node to
        my_c.input_node
```

```
                        -continued
          input_paths_csp <- input_paths_csp OR
            input_path.csp_representation
        // generating the csp problem that represents the
        //outgoing paths from true_c. For each outgoing path
        //we also define the value of the final_resource
        //(i.e, the assignment constraint)
      true_c_outgoing_paths_csp <- false
      for each path (true_outgoing_path) from
        true_c.target_node to leaf-node
        true_outgoing_path_csp <-
          true_outgoing_path.csp_representation
            INTERSECT 'true_final_resource ==
              true_outgoing_path.leaf_node.
              assignment_constraint'
        true_c_outgoing_paths_csp <-
          true_c_outgoing_paths_csp OR
          true_outgoing_path_csp
        //generating the csp problem that represents the
        //outgoing paths from false_c. For each
        //outgoing path, we also define the value of
        //the final-resource assuming a
        //false-implementation
      false_c_outgoing_paths_csp <- false
      for each path (false_path) from false_c.target_node to
leaf-node
        false_outgoing_path_csp <-
          false_path.csp_representation INTERSECT
            'false_final_resource ==
          current_path.leaf_node.assignment_constraint'
        false_c_outgoing_paths_csp <-
          false_c_outgoing_paths_csp OR
          false_outgoing_path_csp
        // define the observation requirements
        obervation_csp <- true_final_resource !=
          false_final_resource
        csp1 <- INTERESECT(input_paths_csp,
          true_c.transition_constraint,
          true_c_outgoing_paths_csp,
          false_c_outgoing_paths_csp,
          observation_csp)
      solve csp1 and generate the corresponding test
```

The invention claimed is:

1. A computer-implemented method for validating compliance of a process executed by a design-under-test with a specification of said process, comprising the steps of:

modeling said process on a computer system as a directed acyclic graph having nodes and edges that connect said nodes, wherein said nodes represent stages of said process, and said edges represent transitions between said stages;

defining a coverage model for said graph that includes correct traversal paths and erroneous traversal paths therein;

defining a set of test cases for said process according to said coverage model;

introducing false nodes and false edges into said graph that represent new transitions between said stages and correspond respectively to external misinterpretations of said specification, thereby defining erroneous traversal paths that extend through said false nodes via said false edges;

executing said process using said design under-test and said set of test cases;

observing that one of said erroneous traversal paths was followed in said step of executing; and responsively to said step of observing, reporting that said process is not compliant with said specification.

2. The method according to claim 1, wherein in said coverage model a first correct traversal path and a second erroneous traversal path extend from one of said nodes via different edges, and wherein defining a set of test cases comprises the steps of:

formulating at least one test case of said set of test cases as a constraint satisfaction problem, wherein outcomes at a terminal node of said graph of said one test case differ when calculated according to said first correct traversal path and when calculated according to said second erroneous traversal path; and solving said constraint satisfaction problem to determine inputs for said one test case.

3. The method according to claim 1, wherein said step of introducing false nodes and false edges is performed at least partially automatically.

4. The method according to claim 1, further comprising the step of defining a coverage metric applicable to said graph.

5. The method according to claim 4, wherein said coverage metric measures coverage of said correct traversal paths and said erroneous traversal paths of said graph.

6. The method according to claim 4, wherein said coverage metric measures coverage of said edges and said false edges of said graph.

7. The method according to claim 1, wherein said process comprises behavior of instructions of a processor instruction set architecture.

8. A computer software product for validating compliance of a process executed by a design-under-test with a specification of said process, including a tangible computer-readable medium in which computer program instructions are stored, which instructions, when read by a computer, cause the computer to:

model said process as a directed acyclic graph having nodes and edges that connect said nodes, wherein said nodes represent stages of said process, and said edges represent transitions between said stages;

define a coverage model for said graph that includes correct traversal paths and erroneous traversal paths therein;

define a set of test cases for said process according to said coverage model;

introduce false nodes and false edges into said graph that represent new transitions between said stages and correspond respectively to external misinterpretations of said specification, thereby defining erroneous traversal paths that extend through said false nodes via said false edges;

execute said process using said design-under-test and said set of test cases;

make a determination that one of said erroneous traversal paths was followed in an execution of said process; and responsively to said determination, report that said process is not compliant with said specification.

9. The computer software product according to claim 8, wherein in said coverage model a first correct traversal path and a second erroneous traversal path extend from one of said nodes via different edges, and wherein said computer is further instructed to define said set of test cases by:

formulating at least one test case of said set of test cases as a constraint satisfaction problem, wherein outcomes at a terminal node of said graph of said one test case differ when calculated according to said first correct traversal path and when calculated according to said second erroneous traversal path; and solving said constraint satisfaction problem to determine inputs for said one test case.

10. The computer software product according to claim 8, wherein said computer is further instructed to define a coverage metric applicable to said graph.

11. The computer software product according to claim 10, wherein said coverage metric measures coverage of said correct traversal paths and said erroneous traversal paths of said graph.

12. A system for validating compliance of a process executed by a design-under-test with a specification of said process, comprising:

a processor;

a memory, accessible to said processor;

said processor executing programs that are stored in said memory, said processor operative to:

model said process as a directed acyclic graph having nodes and edges that connect said nodes, wherein said nodes represent stages of said process, and said edges represent transitions between said stages;

define a coverage model for said graph that includes correct traversal paths and erroneous traversal paths therein;

define a set of test cases for said process according to said coverage model;

introduce false nodes and false edges into said graph that represent new transitions between said stages and correspond respectively to external misinterpretations of said specification, thereby defining erroneous traversal paths that extend through said false nodes via said false edges;

execute said process using said design-under-test and said set of test cases;

determine that one of said erroneous traversal paths was followed in an execution of said process; and thereafter report that said process is not compliant with said specification.

13. The system according to claim 12, wherein in said coverage model a first correct traversal path and a second erroneous traversal path extend from one of said nodes via different edges, and wherein said processor is operative to define said set of test cases by:

formulating at least one test case of said set of test cases as a constraint satisfaction problem, wherein outcomes of said one test case at a terminal node of said graph differ when calculated according to said first correct traversal path and when calculated according to said second erroneous traversal path; and solving said constraint satisfaction problem to determine inputs for said one test case.

14. The system according to claim 13, wherein said process comprises behavior of instructions of a processor instruction set architecture.

15. The system according to claim 12, wherein said processor is operative to define a coverage metric applicable to said graph.

16. The system according to claim 15, wherein said coverage metric measures coverage of said correct traversal paths and said erroneous traversal paths and of said graph.

17. The system according to claim 15, wherein said coverage metric measures coverage of said edges and said false edges of said graph.

* * * * *